(12) United States Patent
Back et al.

(10) Patent No.: US 6,372,615 B2
(45) Date of Patent: Apr. 16, 2002

(54) MOSFET AND FABRICATION METHOD THEREOF

(75) Inventors: Young-Kum Back; Yeon-Woo Cheong, both of Kyungsangnam-Do (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/871,711

(22) Filed: Jun. 4, 2001

Related U.S. Application Data

(62) Division of application No. 09/373,705, filed on Aug. 13, 1999, now Pat. No. 6,278,161.

(30) Foreign Application Priority Data

Mar. 18, 1999 (KR) .............................. 99-9257

(51) Int. Cl.[7] ................. H01L 21/336; H01L 21/3205; H01L 21/4763
(52) U.S. Cl. ..................... 438/589; 438/270
(58) Field of Search ................... 438/212, 230, 438/149, 259, 151, 158, 270, 268, 197, 589

(56) References Cited

U.S. PATENT DOCUMENTS

| | | | | |
|---|---|---|---|---|
| 5,395,780 A | * | 3/1995 | Hwang | 437/44 |
| 5,486,708 A | * | 1/1996 | Takahashi et al. | 257/59 |
| 5,512,517 A | * | 4/1996 | Bryant | 437/203 |
| 5,844,273 A | * | 12/1998 | Konishi | 257/331 |
| 5,883,399 A | * | 3/1999 | Yin et al. | 257/66 |
| 5,915,180 A | * | 6/1999 | Hara et al. | 438/270 |
| 5,942,767 A | * | 8/1999 | Na et al. | 257/59 |
| 6,278,161 B1 | * | 8/2001 | Back et al. | 257/396 |

* cited by examiner

Primary Examiner—John F. Niebling
Assistant Examiner—Walter L. Lindsay, Jr.
(74) Attorney, Agent, or Firm—Fleshner & Kim, LLP

(57) ABSTRACT

A MOSFET is fabricated by forming a trench in a semiconductor substrate, forming an insulating film in the trench, forming a gate electrode to fill in the trench, forming a gate oxide on the gate electrode, the insulating film and an adjacent portion of the semiconductor substrate, forming a first silicon film on the semiconductor substrate and on a portion of the gate oxide, and forming a second silicon film on a portion of the gate oxide on which the first silicon film is not formed. Since the thusly fabricated MOSFET has a controlled channel length, modeling of the device can be easily achieved and its mass-producibility is improved.

12 Claims, 4 Drawing Sheets

MOSFET AND FABRICATION METHOD THEREOF

This application is a Divisional of application Ser. No. 09/373,705 filed Aug. 13, 1999 now U.S. Pat. No. 6,278,161.

BACKGROUND OF THE INVENTION

1. Field of the Invention

The present invention relates to a metal oxide semiconductor field effect transistor (MOSFET) and to a fabrication method thereof, and more particularly to a transistor for a MOSFET for a semiconductor device and a fabrication method thereof that controls a channel length.

2. Description of the Conventional Art

In a conventional MOSFET, a channel region is formed in a semiconductor substrate. FIGS. 1A through 1C illustrate a fabrication method of a conventional MOSFET.

A first oxide 2 and a polycrystalline silicon film 3 are sequentially formed on a semiconductor substrate 1 and then a first photoresist film (not shown) is formed on the polycrystalline silicon film 3. Then, the first photoresist film is patterned by being selectively exposed to optical radiation and then developed, so that a pattern of the first photoresist film partially remains at a portion on which a gate electrode is to be formed. As shown in FIG. 1A, using the patterned first photoresist film as a mask, the first oxide 2 and the polycrystalline silicon film 3 are selectively etched and then the patterned first photoresist film remaining on the polycrystalline silicon film 3 is removed. Here, the etched polycrystalline silicon film 3 and the first oxide 2 shown in FIG. 1A become a gate electrode and a gate oxide, respectively, of a MOSFET. As shown in FIG. 1B, impurity ions are implanted into the entire exposed surface of the semiconductor substrate using the polycrystalline silicon film 3 as a mask and then drive-in diffused, thereby forming a first source-drain impurity region 4 the dopant density of which is lower than that of a second source-drain impurity region 6 which will be formed in a following process. Then, a second oxide is formed on the polycrystalline silicon film 3 and the semiconductor substrate 1 and the second oxide is etched-back, so that the second oxide remains only at side surfaces of the polycrystalline silicon film 3, as shown in FIG. 1C, thereby forming sidewalls 5 of the second oxide. Next, using the polycrystalline silicon film 3 and the sidewalls 5 as a mask, impurity ions at high density are implanted into the surface of the semiconductor substrate 1 and drive-in diffused, thereby forming the second source-drain impurity regions 6, thus completing the fabrication of the conventional MOSFET.

However, the fabrication method of the conventional MOSFET has a problem, in that since the gate oxide is obtained by etching the first oxide, time dependent dielectric breakdown (TDDB) can occur due to damage incurred during the etching process, which results in deterioration of the gate oxide. Also, in the MOSFET, since the channel length can not be controlled, integration of a device increases, which results in a short channel effect and risk of a punch through defect. Accordingly, since the device geometry can not be controlled, a modeling of the device is difficult and a large margin for the device is required in the device fabrication, thus reducing mass-productibility.

SUMMARY OF THE INVENTION

Accordingly, the present invention is directed to a MOSFET and a fabrication method thereof which obviates the problems and disadvantages in the conventional art.

An object of the present invention is to provide a MOSFET and a fabrication method thereof that controls a channel length, thereby enabling modeling of the device and improving its mass-producibility.

To achieve these and other advantages and in accordance with the purpose of the present invention, as embodied and broadly described herein, there is provided a MOSFET which includes: a semiconductor substrate having a trench formed therein; an insulating film formed in the trench; a gate electrode formed on the insulating film; a gate oxide formed on the gate electrode, on the insulating film and on an adjacent portion of the semiconductor substrate; a first silicon film formed on the semiconductor substrate and on a portion of the gate oxide; and a second silicon film formed on a portion of the gate oxide on which the first silicon film is not formed.

Also, to achieve the objects of the present invention, there is provided a fabrication method of a MOSFET includes: forming a trench in a semiconductor substrate; forming an insulating film in the trench; forming a gate electrode to fill in the trench; forming a gate oxide on the gate electrode, on the insulating film and on an adjacent portion of the semiconductor substrate; forming a first silicon film on the semiconductor substrate and on a portion of the gate oxide; and forming a second silicon film on a portion of the gate oxide on which the first silicon film is not formed.

BRIEF DESCRIPTION OF THE DRAWINGS

The accompanying drawings, which are included to provide a further understanding of the invention and which are incorporated in and constitute a part of this specification, illustrate embodiments of the invention and together with the description serve to explain the details of the invention.

In the drawings.

DETAILED DESCRIPTION OF THE INVENTION

Reference will now be made in detail to the preferred embodiment of the present invention, examples of which are illustrated in the accompanying drawings.

FIGS. 2A through 2I are cross-sectional diagrams which sequentially illustrate a fabrication method of a MOSFET according to the present invention.

Figure 1A:
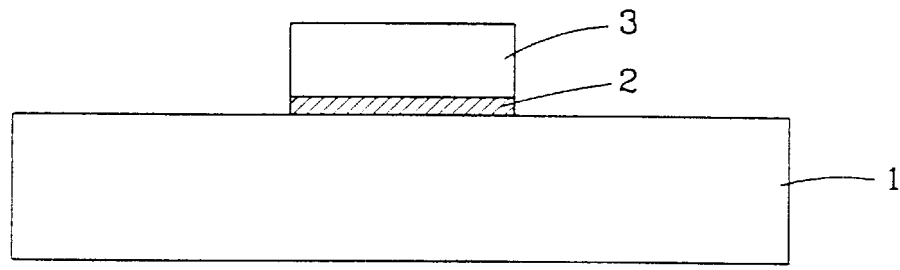
FIGS. 1A through 1C are cross-sectional diagrams which sequentially illustrate a fabrication method of a conventional MOSFET.
Figure 1B:
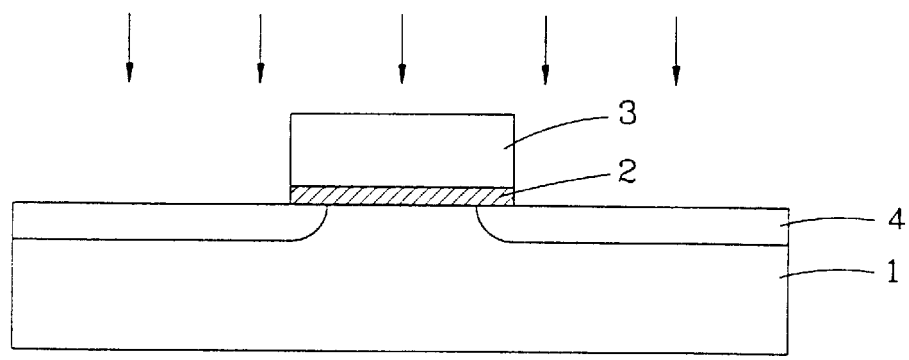
Figure 1C:
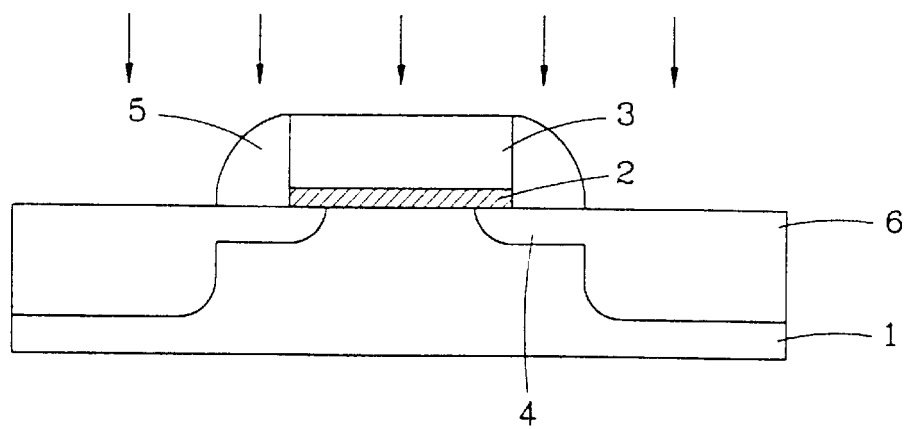
Figure 2A:
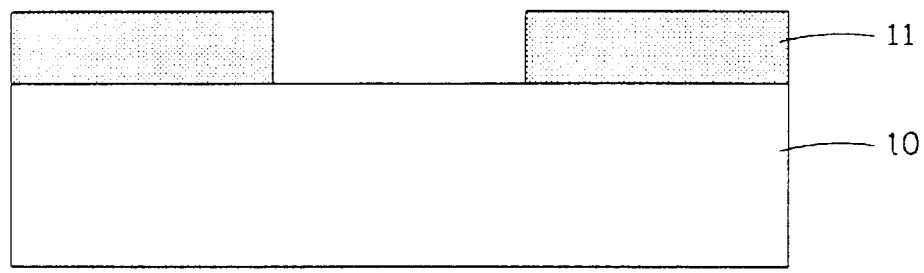
FIGS. 2A through 2I are cross-sectional diagrams which sequentially illustrate a fabrication method of a MOSFET according to the present invention.
Figure 2B:
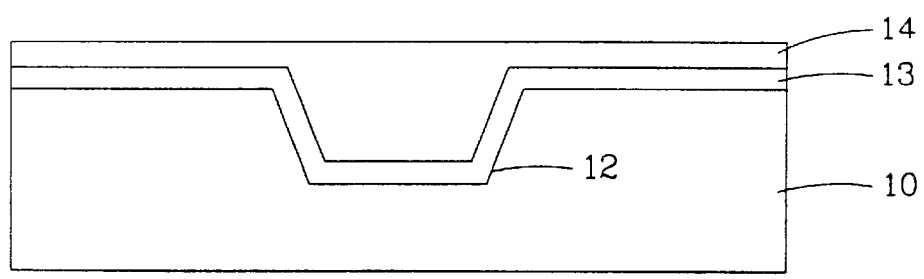
Figure 2C:
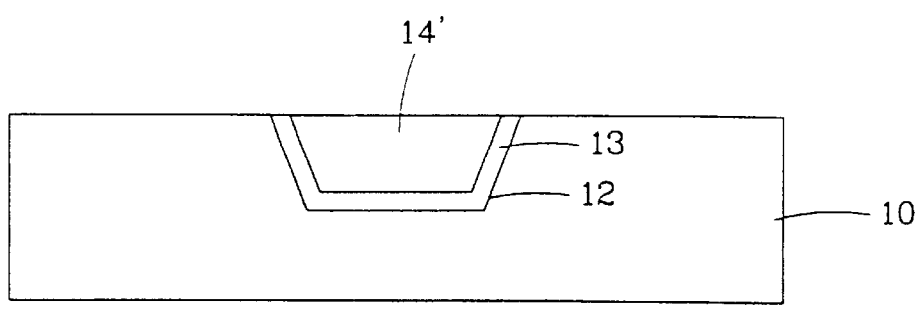

As shown in FIG. 2A, a first photoresist film 11 is formed on a semiconductor substrate 10 and is patterned to expose a region for subsequently forming a gate electrode 14'. Using the patterned first photoresist film 11 as a mask, the semiconductor substrate 10 is selectively etched in a trench forming process, as shown in FIG. 2B, for thereby forming a trench 12. After removing the patterned first photoresist film 11, an insulating film 13 is formed on the semiconductor substrate 10 by a chemical vapor deposition (CVD) process or a thermal oxidation process, the insulating film 13 being formed of silicon oxide or silicon nitride for insulating the semiconductor substrate 10 from the gate electrode 14' which is to be formed in a following process. Then, an electrode material 14 is formed on the insulating film 13 in order to serve for forming the gate electrode 14'. Next, the gate electrode 14' is formed, as shown in FIG. 2C, by performing a chemical mechanical polishing (CMP) process until the electrode material 14 has the same surface level as the semiconductor substrate 10. Accordingly, an upper surface of the insulating film 13 is exposed at a periphery of the gate electrode 14' and the semiconductor substrate 10 which is insulated from the gate electrode 14' by the insulating film 13 is also exposed.

Figure 2D:
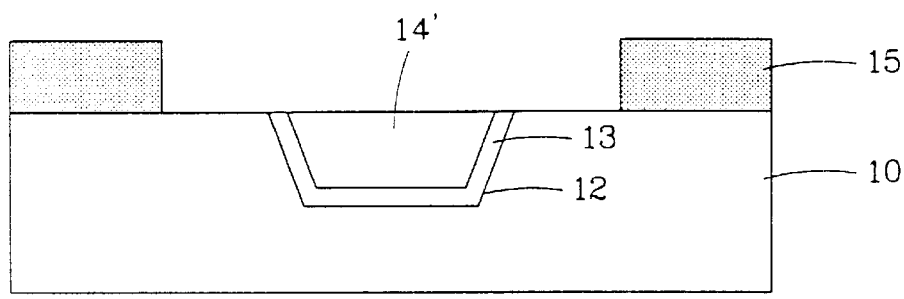
Figure 2E:
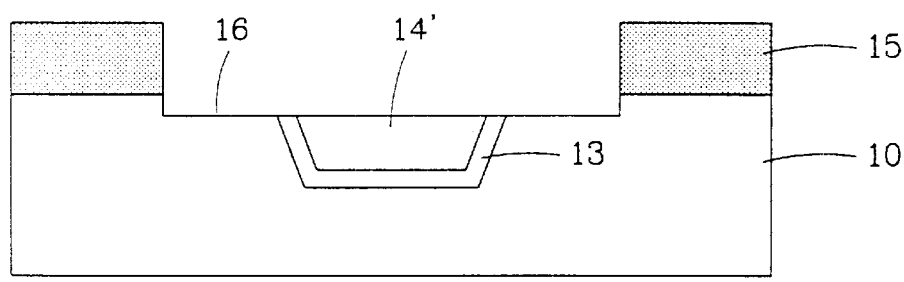

As shown in FIG. 2D, a patterned second photoresist film 15 is formed on the semiconductor substrate 10, for exposing a portion 16 thereof where a gate oxide 16' is to be formed in a following process. The portion 16 where the gate oxide 16' is to be formed corresponds to the gate electrode 14', the insulating film 13 and an adjacent part of the semiconductor substrate 10. Next, using the patterned second photoresist film 15 as a mask, the portion 16 where the gate oxide 16' is to be formed is etched, as shown in FIG. 2E. The etching process is generally achieved by a dry etching process and the depth to be etched is controlled by the pressure of the etchant gas and the etching time. Here, the depth is preferably 50–150A.

Figure 2F:
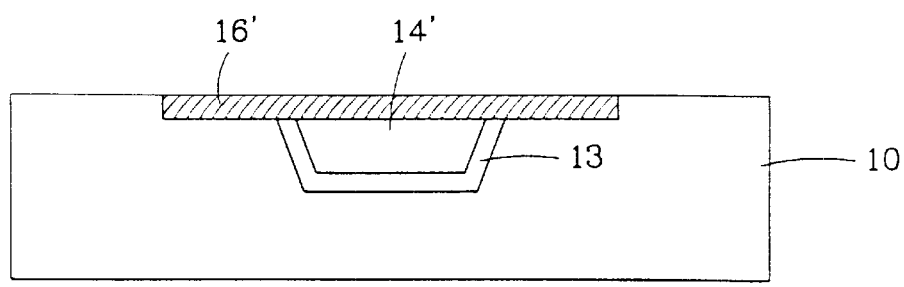

As shown in FIG. 2F, the patterned second photoresist film 15 is removed and then in order to fill the etched portion, the gate oxide 16' is formed over the semiconductor substrate 10 by a thermal oxidation process. Here, the gate oxide 16' is formed of high purity silicon oxide and insulates the gate electrode 14' from a channel region which is to be formed in a following process. Also, the CMP process is applied until the gate oxide 16' has the same surface level as the surrounding semiconductor substrate 10.

Figure 2G:
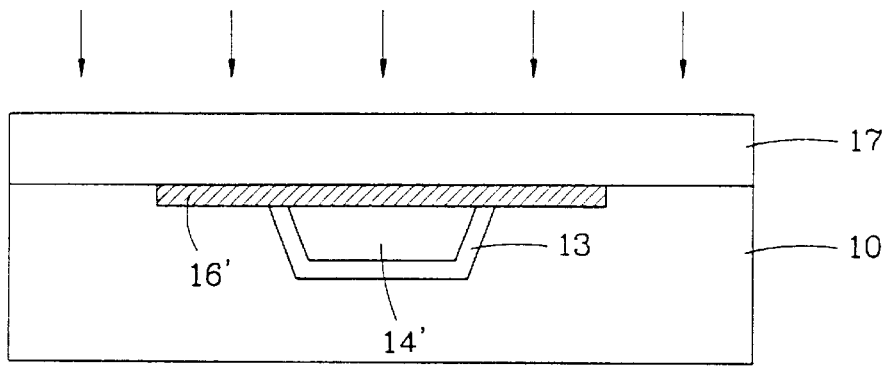

A first silicon film 17 is deposited over an entire surface of the semiconductor substrate 10 including the gate oxide 16' and then a high density of impurity ions are implanted into the first silicon film 17, as shown in FIG. 2G.

Figure 2H:
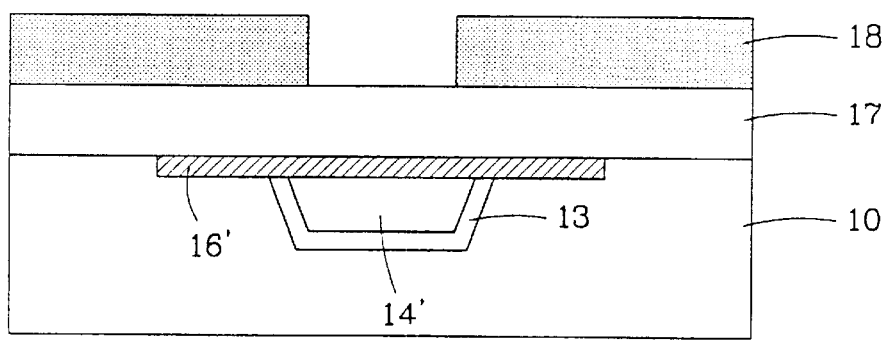
Figure 2I:
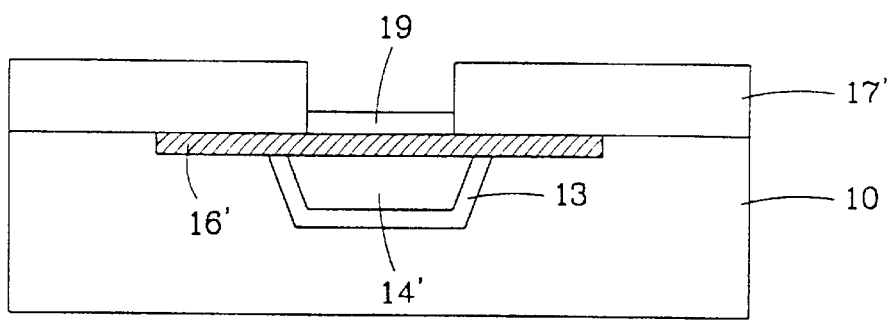

As shown in FIG. 2H, a third photoresist film 18 is formed on the first silicon film 17 and then patterned to define source-drain impurity regions 17'. Here, it is noted that when patterning the third photoresist film 18, the patterned portion of the third photoresist film 18 corresponds to an upper portion of the gate electrode 14' and has an opening the width of which is narrower than that of the gate oxide 16'. The first silicon film 17 is exposed through the opening. Since, as can be seen in regard to a next process, the opened area serves as the channel region, the third photoresist film 18 is patterned in accordance with a desired size of the channel region. The exposed portion of the first silicon film 17 is completely etched using the patterned third photoresist film 18 as a mask, for thereby exposing a portion of the gate oxide 16' which is formed below the etched portion of the first silicon film 17. Accordingly, as shown in FIG. 2I, the first silicon film 17 is separated into two parts. The separated first silicon film 17 is defined as source-drain impurity regions 17'. Then, the patterned third photoresist film 18 is removed and then a second silicon film 19 is selectively formed on the exposed portion of the gate oxide 16', thereby completing the fabrication of the MOSFET. Here, it is to be noted that the second silicon film 19 is formed thinner than the source-drain impurity regions 17' by a straight-forwarded sputtering process or a low pressure chemical vapor deposition (LPCVD) process, the second silicon film 19 becoming the channel region in the operation of the transistor.

As described above, to fabricate the MOSFET according to the present invention, the gate oxide is deposited on the region which is previously specifically provided for forming the gate oxide, which is different from the conventional art wherein the gate oxide is obtained by etching an oxide layer, thereby avoiding the risk of TDDB which results in deterioration of the gate oxide obtained by conventionally etching the oxide layer due to damage incurred during the etching process. Further, since the channel length can be precisely controlled, the short channel effect and punch through defects can be prevented. Accordingly, the modeling of the device can be easily achieved and less margin for the device is required than for the conventional transistor, thereby improving the mass-producibility.

It will be apparent to those skilled in the art that various modifications and variations can be made in the transistor for the semiconductor device and fabrication method thereof of the present invention without departing from the spirit or scope of the invention. Thus, it is intended that the present invention cover the modifications and variations of this invention provided they come within the scope of the appended claims and their equivalents.

What is claimed is:

1. A fabrication method for a MOSFET, comprising the steps of:

forming a trench in a semiconductor substrate;

forming an insulating film in the trench;

forming a gate electrode to fill in the trench;

forming a gate oxide on the gate electrode, on the insulating film and on an adjacent portion of the semiconductor substrate;

forming a first silicon film on the semiconductor substrate and on a portion of the gate oxide; and forming a second silicon film on a portion of the gate oxide on which the first silicon film is not formed.

2. The fabrication method for the transistor according to claim 1, wherein the trench is formed by etdhing the semiconductor substrate by a photo-lithographic masking and etching process.

3. The fabrication method for the transistor according to claim 1, wherein the insulating film is formed by a chemical vapor deposition process or a thermal oxidation process.

4. The fabrication method for the transistor according to claim 1, wherein after forming the gate electrode, a chemical mechanical polishing process is applied thereto until the gate electrode is flush with the semiconductor substrate.

5. The fabrication method for the transistor according to claim 1, wherein the gate oxide is formed on a portion of the substrate where the gate electrode, the insulating film and a predetermined part of the semiconductor substrate are etched by a photo-lithographic masking and etching process.

6. The fabrication method for the transistor according to claim 5, wherein a depth of the etched portion is 50–150A.

7. The fabrication method for the transistor according to claim 1, wherein the gate oxide is formed by a thermal oxidation.

8. The fabrication method for the transistor according to claim 1, wherein after forming the gate oxide, a chemical mechanical polishing is applied thereto until the gate electrode is flush with the semiconductor substrate.

9. The fabrication method for the transistor according to claim 1, wherein the step of forming the first silicon film on the semiconductor substrate and the portion of the gate oxide is accomplished by forming the first silicon film over an entire surface of the semiconductor substrate including the gate oxide and then selectively etching a portion of the first silicon film corresponding to an upper portion of the gate oxide by a photo-lithographic masking and etching process, for thereby exposing a part of the gate oxide.

10. The fabrication method for the transistor according to claim 9, wherein the first silicon film is formed on the semiconductor substrate and on the portion of the gate oxide by forming the first silicon film over the entire surface of the semiconductor substrate including the gate oxide, implanting impurity ions into the resultant structure and then selectively etching the portion of the first silicon film which corresponds to the upper portion of the gate oxide by the photo-lithographic masking and etching process, thereby partially exposing the gate oxide.

11. The fabrication method for the transistor according to claim 1, wherein the second silicon film is formed thinner than the first silicon film.

12. The fabrication method for the transistor according to claim 1, wherein the second silicon film is formed by a straight-forwarded sputtering process or a low pressure chemical vapor deposition process.

* * * * *